United States Patent
Matsunami

(10) Patent No.: US 8,958,235 B2
(45) Date of Patent: Feb. 17, 2015

(54) SEMICONDUCTOR MEMORY DEVICE

(71) Applicant: Kabushiki Kaisha Toshiba, Tokyo (JP)

(72) Inventor: Junya Matsunami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 13/771,491

(22) Filed: Feb. 20, 2013

(65) Prior Publication Data

US 2014/0063907 A1 Mar. 6, 2014

Related U.S. Application Data

(60) Provisional application No. 61/695,610, filed on Aug. 31, 2012.

(51) Int. Cl.
*G11C 11/00* (2006.01)
*G11C 13/00* (2006.01)

(52) U.S. Cl.
CPC ........ *G11C 13/0064* (2013.01); *G11C 13/0069* (2013.01); *G11C 13/0097* (2013.01); *G11C 13/0002* (2013.01)
USPC ........................ 365/148; 365/189.07; 365/175

(58) Field of Classification Search
CPC ........... G11C 13/0097; G11C 13/0064; G11C 13/0069
USPC ...................................... 365/148, 189.07, 175
See application file for complete search history.

(56) References Cited

U.S. PATENT DOCUMENTS

| | | | |
|---|---|---|---|
| 7,242,615 B2 | 7/2007 | Nagashima | |
| 7,529,124 B2 * | 5/2009 | Cho et al. | 365/163 |
| 7,826,248 B2 * | 11/2010 | Xi et al. | 365/148 |
| 7,869,270 B2 * | 1/2011 | Lee | 365/163 |
| 7,948,790 B2 * | 5/2011 | Tsukamoto et al. | 365/148 |
| 8,031,511 B2 * | 10/2011 | Osada et al. | 365/148 |
| 8,077,496 B2 * | 12/2011 | Choi | 365/148 |
| 8,159,859 B2 * | 4/2012 | Maejima | 365/148 |
| 8,184,470 B2 * | 5/2012 | Toda et al. | 365/148 |
| 8,271,856 B2 * | 9/2012 | Kang et al. | 714/764 |
| 8,537,598 B2 * | 9/2013 | Maejima et al. | 365/148 |
| 8,593,853 B2 * | 11/2013 | Katoh | 365/148 |
| 8,699,258 B2 * | 4/2014 | Chien et al. | 365/148 |
| 8,804,401 B2 * | 8/2014 | Sugimae et al. | 365/148 |

FOREIGN PATENT DOCUMENTS

| | | |
|---|---|---|
| JP | 10-208499 | 8/1998 |
| JP | 2004-55073 | 2/2004 |
| JP | 3636228 | 1/2005 |
| JP | 2006-12367 | 1/2006 |
| JP | 2010-218616 | 9/2010 |

* cited by examiner

*Primary Examiner* — Viet Q Nguyen

(74) *Attorney, Agent, or Firm* — Oblon, Spivak, McClelland, Maier & Neustadt, L.L.P.

(57) ABSTRACT

This semiconductor memory device comprises: a memory cell array configured as an arrangement of memory cells disposed at intersections of a plurality of first lines disposed substantially in parallel and a plurality of second lines disposed to intersect the first lines, each of the memory cells including a variable resistance element; and a control circuit configured to control the memory cell array. The control circuit is configured to change a voltage value of a resetting verify voltage applied for confirming completion of the resetting operation according to a degree of change of resistance of the memory cell when performing the resetting operation to change the memory cell from a low-resistance state to a high-resistance state.

18 Claims, 8 Drawing Sheets

SEMICONDUCTOR MEMORY DEVICE

CROSS REFERENCE TO RELATED APPLICATIONS

This application is based on and claims the benefit of priority from prior U.S. Provisional Patent Application 61/695,610, filed on Aug. 31, 2012, the entire contents of which are incorporated herein by reference.

FIELD

Embodiments described below relate to a semiconductor memory device.

BACKGROUND

In recent years, resistance change memory that employs a variable resistance element as a storage element has been receiving attention as a successor candidate of flash memory. A memory cell in a resistance change memory includes a variable resistance film configured from the likes of carbon or a transition metal oxide film, for example. The variable resistance film has a resistance value that changes by applying a required voltage or current to the variable resistance film.

DETAILED DESCRIPTION

An embodiment described below comprises: a memory cell array configured as an arrangement of memory cells disposed at intersections of a plurality of first lines disposed substantially in parallel and a plurality of second lines disposed to intersect the first lines, each of the memory cells including a variable resistance element; and a control circuit configured to control the memory cell array. The control circuit is configured to change a voltage value of a resetting verify voltage applied for confirming completion of the resetting operation according to a degree of change of resistance of the memory cell when performing the resetting operation to change the memory cell from a low-resistance state to a high-resistance state.

Embodiments of a nonvolatile semiconductor memory device according to the present invention are described below with reference to the drawings.

First Embodiment

Overall Configuration

Figure 1:
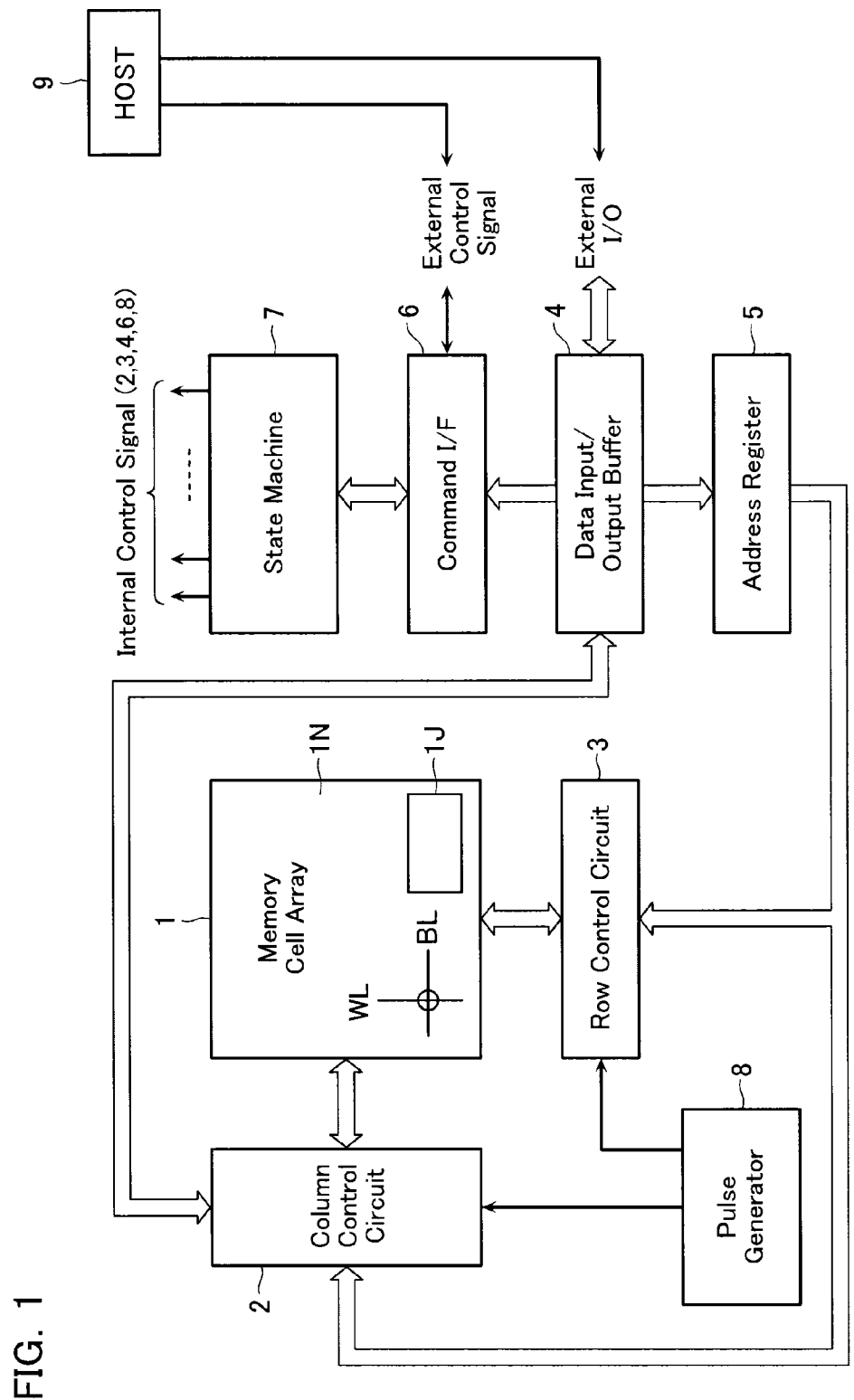
FIG. 1 is a block diagram of a nonvolatile memory according to a first embodiment.

FIG. 1 is a block diagram showing a configuration of a nonvolatile memory according to a first embodiment. This nonvolatile memory comprises a memory cell array 1 in which memory cells are disposed in a matrix, each of the memory cells using a ReRAM (variable resistance element) which will be described later. Note that the memory cell array 1 comprises a normal memory cell array 1N for performing ordinary write of data, and a judgment-dedicated memory cell array 1J which is subject to a judgment mode which will be described later.

Disposed at a position adjacent to the memory cell array 1 in a bit line BL direction of the memory cell array 1 is a column control circuit 2 for controlling bit lines BL of the memory cell array 1 and performing data erase of the memory cells, data write to the memory cells, and data read from the memory cells. In addition, disposed at a position adjacent to the memory cell array 1 in a word line WL direction of the memory cell array 1 is a row control circuit 3 for selecting word lines WL of the memory cell array 1 and applying a voltage required in data erase of the memory cells, data write to the memory cells, and data read from the memory cells.

A data input/output buffer 4 is connected to an external host 9 via an input/output (I/O) line to receive write data, receive an erase command, output read data, and receive address data, command data, and so on. The data input/output buffer 4 sends received write data to the column control circuit 2, and receives read data from the column control circuit 2 to be outputted to external. An address supplied to the data input/output buffer 4 from external is sent to the column control circuit 2 and the row control circuit 3 via an address register 5.

In addition, a command supplied to the data input/output buffer 4 from the host 9 is sent to a command interface 6. The command interface 6 receives an external control signal from the host 9, judges whether data inputted to the data input/output buffer 4 is write data or a command or an address, and, if a command, receives the data and transfers it to a state machine 7 as a command signal.

The state machine 7 (control circuit) performs management of this nonvolatile memory overall, and receives a command from the host 9 via the command interface 6 to perform management of read, write, erase, input/output of data, and so on. In addition, it is also possible for status information managed by the state machine 7 to be received by the external host 9, thereby allowing the external host 9 to judge an operation result. Moreover, this status information may be employed also in control of write and erase. Furthermore, the state machine 7 controls a pulse generator 8. This control enables the pulse generator 8 to output a pulse of any voltage and any timing.

Now, the pulse formed may be transferred to any line selected by the column control circuit 2 and the row control circuit 3. Note that peripheral circuit elements other than the memory cell array 1 may be formed in a semiconductor substrate directly below the memory cell array 1 formed in a wiring layer. This enables chip area of this nonvolatile memory to be made substantially equal to area of the memory cell array 1.

Memory Cell Array 1

Figure 2:
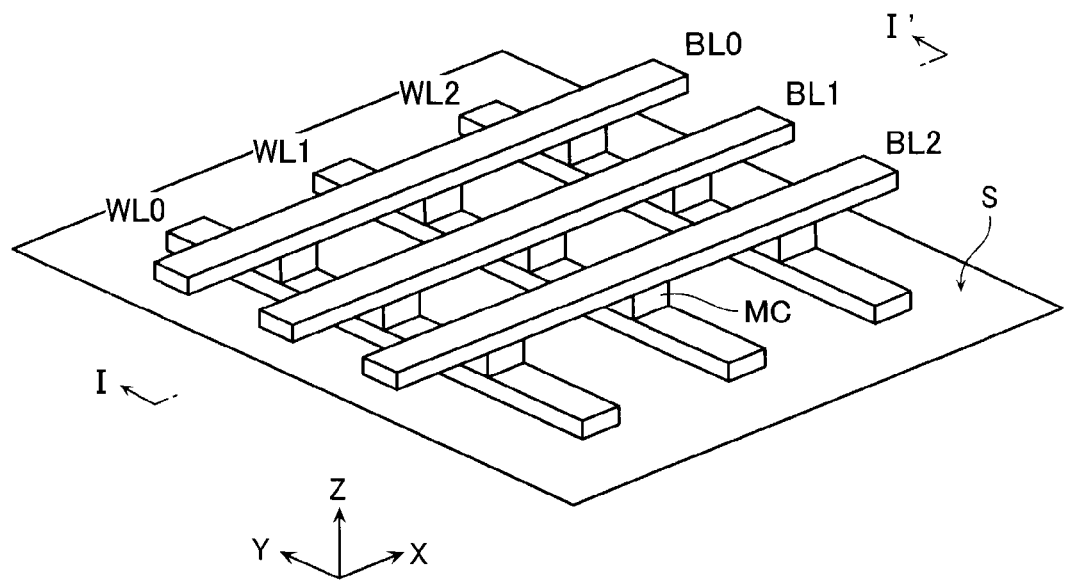
FIG. 2 is a perspective view of part of a memory cell array 1.
Figure 3:
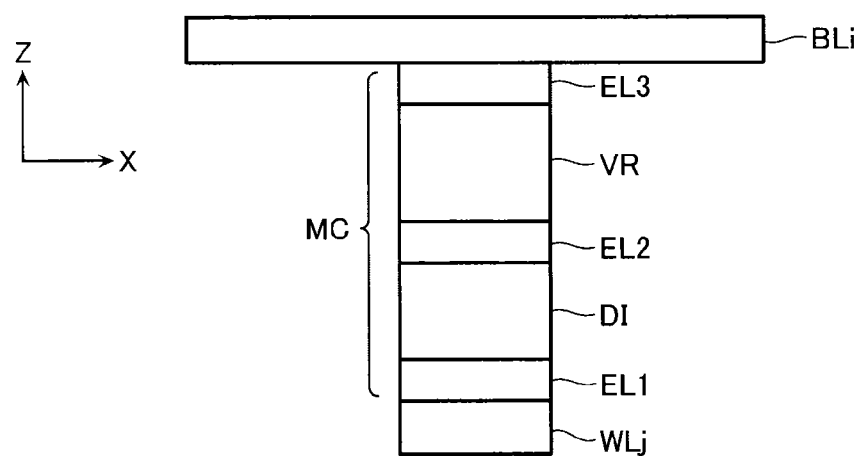
FIG. 3 is a cross-sectional view taken along the line I-I' looking in the direction of the arrows in FIG. 2, showing a single memory cell portion.

FIG. 2 is a perspective view of part of the memory cell array 1, and FIG. 3 is a cross-sectional view taken along the line I-I' looking in the direction of the arrows in FIG. 2, showing a single memory cell portion. Word lines WL0~WL2 acting as the plurality of first lines are arranged in a Y direction parallel to a surface of a semiconductor substrate S, and bit lines BL0~BL2 acting as the plurality of second lines are arranged in an X direction parallel to the surface of the semiconductor substrate S so as to intersect these word lines WL0~WL2. Memory cells MC are disposed at each of intersections of the word lines WL0~WL2 and the bit lines BL0~BL2 so as to be sandwiched by both lines. The first and second lines are preferably of a material that is heat-resistant and has a low resistance. For example, W, WSi, NiSi, CoSi, and so on, may be employed as the material of the first and second lines. A detailed configuration of this memory cell array 1 will be described later.

Memory Cell MC

As shown in FIG. 3, the memory cell MC is a circuit having a variable resistance element VR and a diode DI acting as a rectifier element connected in series in a Z direction perpendicular to the semiconductor substrate S. Employed as the variable resistance element VR is a material capable of having its resistance value changed by a voltage application, via a current, heat, chemical energy, and soon. Disposed above and below the variable resistance element VR and the diode DI are electrodes EL1, EL2, and EL3 functioning as a barrier metal and an adhesive layer. Disposed on the electrode E1 is the diode DI, and disposed on the diode DI is the electrode EL2. Disposed on the electrode EL2 is the variable resistance element VR, and disposed on the variable resistance element VR is the electrode EL3. Employable as an electrode material of the electrodes EL1, EL2, and EL3 is for example titanium nitride (TiN). Moreover, the electrodes EL1, EL2, and EL3 may also be configured from a different material. For example, the following materials may also be employed as the electrode material of the electrodes EL1 and EL3, namely, Pt, Au, Ag, TiAlN, SrRuO, Ru, RuN, Ir, Co, Ti, TaN, LaNiO, Al, PtIrO$_x$, PrRhO$_x$, Rh, TaAlN, W, and so on. In addition, the following materials may also be employed as the electrode material of the electrode EL2, namely, W, WN, TaN, TaSiN, TaSi$_2$, TiC, TaC, Nb—TiO$_2$, and soon. Moreover, a separate buffer layer, barrier metal layer, adhesive layer, and so on, may also be inserted.

Diode DI

Employable as the diode DI is for example a PN junction diode comprising a p type layer and an n type layer. Moreover, various kinds of diodes such as a Schottky diode, PIN diode, and so on, may also be employed as the diode DI, besides a PN junction diode. Note that the diode DI may be omitted if the variable resistance element VR has a built-in rectifying function.

Variable Resistance Element VR

Examples of a variable resistance element VR include: a phase change memory element having a resistance value changed by a change in state of crystallization/amorphousness of a chalcogenide compound; a MRAM element employing resistance change due to a tunnel magnetoresistance effect; memory elements of CBRAM (Conduction Bridge RAM) having a property of a solid electrolyte and of polymer ferroelectric RAM (PFRAM) having a resistance element formed by a conductive polymer; and a ReRAM element having resistance change caused by electric field application.

For example, employed as a variable resistance element VR of CBRAM is an ion conductive material. Employed as an ion conductive material that includes silicon is for example amorphous silicon or silicon oxide. Other examples of an ion conductive material include silver oxide (Ag$_2$O), silver silicide (Ag$_2$S), silver selenide (AgSe), silver telluride (Ag$_2$Te), silver iodide (AgI), copper iodide (CuI$_2$), copper oxide (CuO), copper sulfide (CuS), copper selenide (CuSe), copper telluride (CuTe), germanium oxide (GeO$_2$), and the like. Moreover, the variable resistance element VR may have a structure where a plurality of layers combining these materials are stacked. Note that these materials may be employed without being limited to the specific composition ratios described here. Ions entering and leaving the variable resistance element VR are supplied from either of the electrode EL2 or the electrode EL3. Therefore, either of the electrode EL2 or the electrode EL3 includes a metal such as Ag, Co, Ni, Cu, or the like, capable of being ionized in the variable resistance element VR.

There are known to be two kinds of forms of a variable resistance element in a resistance change memory. One sets a high-resistance state and a low-resistance state by switching polarity of an applied voltage, and this is called a bipolar type. The other is configured capable of setting a high-resistance state and a low-resistance state by controlling a voltage value and a voltage application time, without switching polarity of an applied voltage, and this is called a unipolar type.

In the case of unipolar type, write of data to the memory cell MC is performed by applying to the variable resistance element VR a certain voltage, for a short time. This causes the variable resistance element VR to change from a high-resistance state to a low-resistance state. Below, this operation to change the variable resistance element VR from a high-resistance state to a low-resistance state is called a setting operation. On the other hand, erase of data in the memory cell MC is performed by applying to the variable resistance element VR in a low-resistance state after the setting operation a certain voltage which is lower than that applied during the setting operation, for a long time. This causes the variable resistance element VR to change from a low-resistance state to a high-resistance state. Below, this operation to change the variable resistance element VR from a low-resistance state to a high-resistance state is called a resetting operation. The memory cell MC assumes for example a high-resistance state to be a stable state (reset state), and in the case of binary data storage, performs write of data by the setting operation for changing a reset state to a low-resistance state.

In the case of bipolar type, a setting operation on the memory cell MC is performed by applying to the variable resistance element VR a certain voltage, for a short time. On the other hand, a resetting operation on the memory cell MC is performed by applying to the variable resistance element VR in a low-resistance state after the setting operation a voltage of reverse polarity to that applied during the setting operation.

Modified Example of Memory Cell Array

Figure 4:
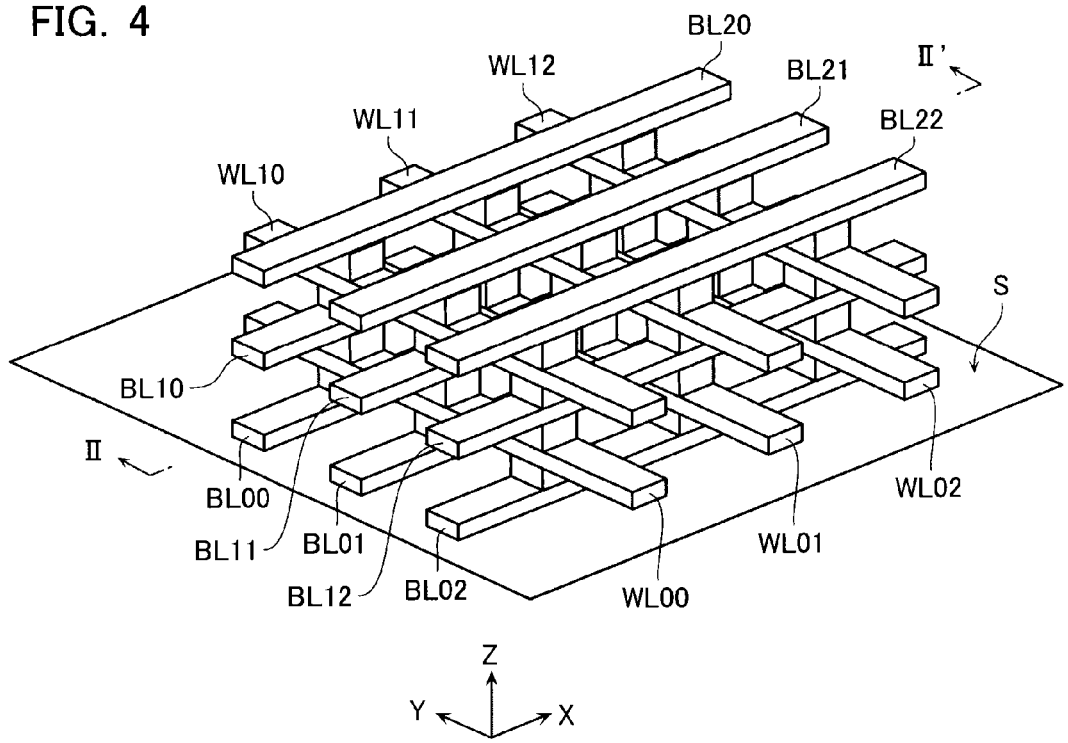
FIG. 4 is a perspective view of part of a memory cell array 1 in a separate example of a configuration.
Figure 5:
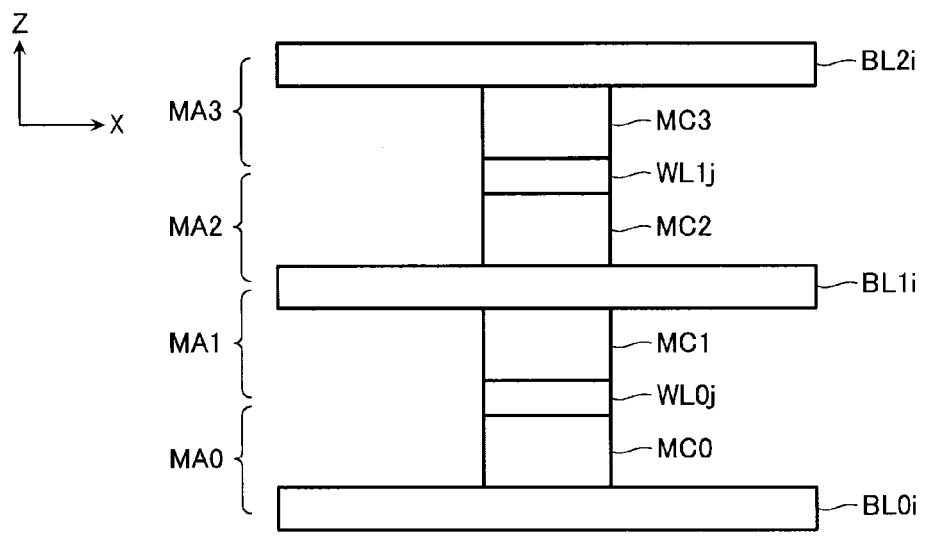
FIG. 5 is a cross-sectional view taken along the line II-II' looking in the direction of the arrows in FIG. 4.

Moreover, as shown in FIG. 4, a three-dimensional structure having the above-described memory cell structure stacked multiply in the Z direction may also be adopted. FIG. 5 is a cross-sectional view showing a cross-section taken along the line II-II' in FIG. 4. The illustrated example is a memory cell array having a four layer structure configured from cell array layers MA0~MA3, and has a word line WL0j shared by memory cells MC0 and MC1 below and above the word line WL0j, a bit line BL1i shared by memory cells MC1 and MC2 below and above the bit line BL1i, and a word line WL1j shared by memory cells MC2 and MC3 below and above the word line WL1j.

In addition, a configuration having an interlayer insulating film interposed between cell array layers such as line/cell/line/interlayer insulating film/line/cell/line may also be adopted, rather than this repetition of line/cell/line/cell. Note that the memory cell array 1 may also be divided into several MATs of memory cell groups. The previously mentioned column control circuit 2 and row control circuit 3 may be provided to each of the MATs, sectors, or cell array layers MA, or may be shared by these. Moreover, a plurality of bit lines BL may also be shared in order to reduce area.

Memory Cell Array and its Peripheral Circuits

Figure 6:
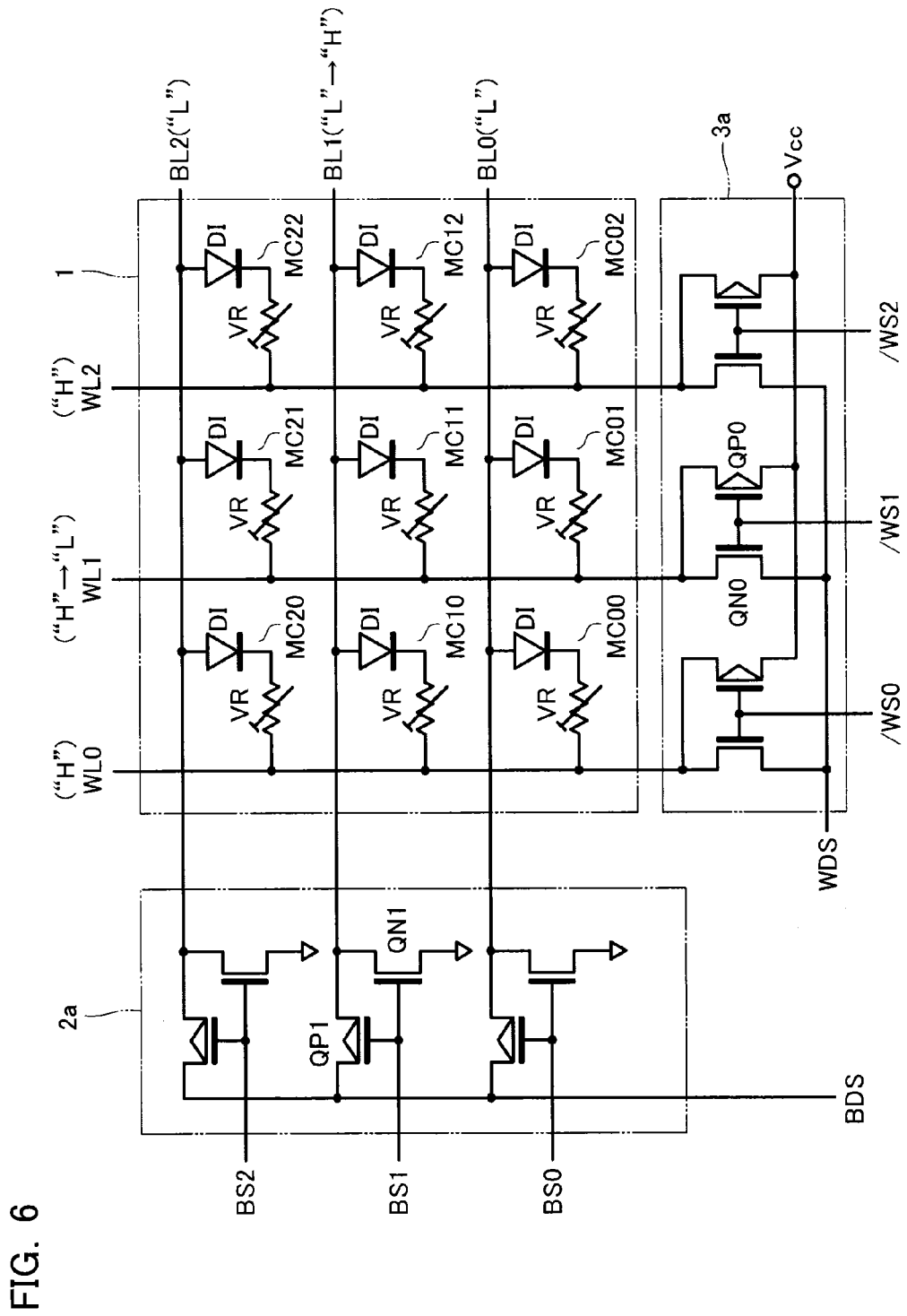
FIG. 6 is a circuit diagram of the memory cell array 1 and its peripheral circuits.

FIG. 6 is a circuit diagram of the memory cell array 1 and its peripheral circuits. Now, in order to simplify explanation, description proceeds taking one layer in a stacking structure as an example. In FIG. 6, the diode DI configuring the memory cell MC has its anode connected to the bit line BL and its cathode connected to the word line WL via the variable resistance element VR. Each of the bit lines BL has its one end connected to a selection circuit 2a which is part of the column control circuit 2. Moreover, each of the word lines WL has its one end connected to a selection circuit 3a which is part of the row control circuit 3.

The selection circuit 2a is configured from a select PMOS transistor QP1 and a select NMOS transistor QN1 provided to each bit line BL and having gates and drains commonly connected. The select PMOS transistor QP1 has its source connected to a bit line side drive sense line BDS that applies a write pulse and causes flow of a current to be detected during data read. The select NMOS transistor QN1 has its source connected to a low potential power supply Vss. The transistors QP1 and QN1 have their shared drains connected to the bit line BL and have their shared gates supplied with a bit line select signal BSi (i=0~2) that selects each bit line BL.

In addition, the selection circuit 3a is configured from a select PMOS transistor QP0 and a select NMOS transistor QN0 provided to each word line WL and having gates and drains commonly connected. The select PMOS transistor QP0 has its source connected to a high potential power supply Vcc. The select NMOS transistor QN0 has its source connected to a word line side drive sense line WDS that applies a write pulse and causes flow of a current to be detected during data read. The transistors QP0 and QN0 have their shared drains connected to the word line WL and have their shared gates supplied with a word line select signal /WSi (i=0~2) that selects each word line WL.

Operations

Next, the setting operation and the resetting operation in this nonvolatile memory according to the first embodiment are described with reference to FIG. 7.

Figure 7:
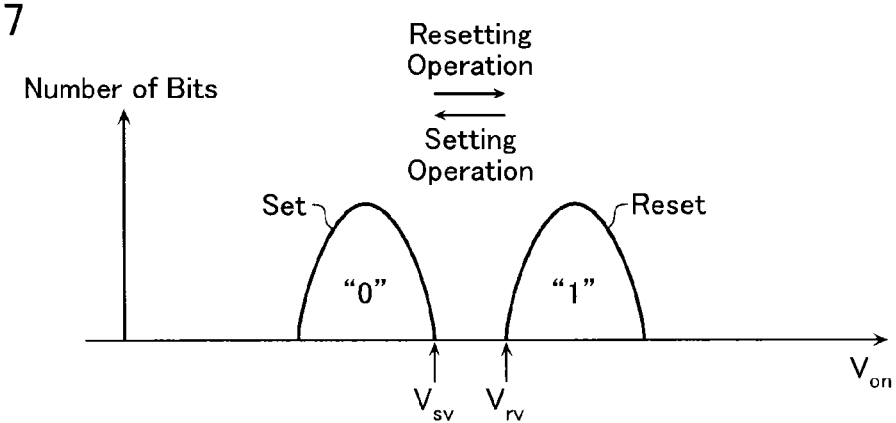
FIG. 7 explains a setting operation and a resetting operation in the nonvolatile memory according to the first embodiment.

FIG. 7 is a graph showing a distribution of an on-voltage Von of the memory cell MC (minimum value of a voltage at which the memory cell MC can switch from a non-conductive state to a conductive state) after completion of a setting mode including a series of the setting operations (Set) and after completion of a resetting mode including a series of the resetting operations (Reset). The memory cell MC after completion of the resetting mode is in a high-resistance state, hence the on-voltage Von is high. On the other hand, the memory cell MC after completion of the setting mode is in a low-resistance state, hence the on-voltage Von is low.

When performing the resetting mode, a resetting verify operation for verifying whether the resetting mode has been completed or not, in other words, whether the on-voltage Von of the memory cell MC subject to the resetting mode has become no less than a certain value or not, is performed. In the resetting verify operation, a resetting verify voltage $V_{rv}$ shown in FIG. 7 is applied between the bit line BL and the word line WL connected to the memory cell MC. By judging whether application of this resetting verify voltage $V_{rv}$ has resulted in the memory cell MC attaining a conductive state or not, it is judged whether the resetting mode has been completed or not.

Conversely, when performing the setting mode, a setting verify operation for verifying whether the setting mode has been completed or not, in other words, whether the on-voltage Von of the memory cell MC subject to the setting mode has become not more than a certain value or not, is performed. In the setting verify operation, a setting verify voltage $V_{sv}$ shown in FIG. 7 is applied between the bit line BL and the word line WL connected to the memory cell MC.

Figure 8:
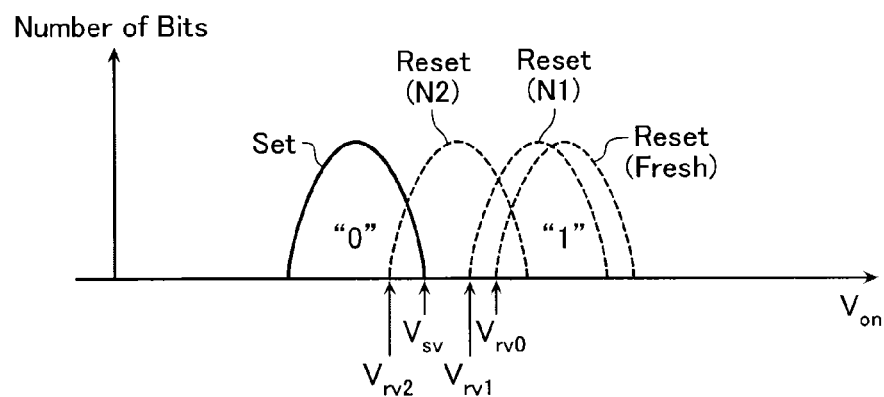
FIG. 8 explains the resetting operation in the nonvolatile memory according to the first embodiment.

In a resistance change memory device having a structure of the first embodiment, when the setting operation and the resetting operation are repeated many times, the variable resistance element gradually deteriorates and a leak current in the memory cell MC gradually increase, making it more difficult for the resetting mode to be completed. Therefore, in the present embodiment, a degree of easiness of completion of the resetting mode is judged (a procedure for performing the judgment will be mentioned later), and, as shown in FIG. 8, a value of the previously-mentioned resetting verify voltage $V_{rv}$ is changed according to that judgment result. For example, in a state immediately after shipment of the resistance change memory device (Fresh), the value of the resetting verify voltage $V_{rv}$ is set to $V_{rv0}$. On the other hand, when a cumulative number of times of executions of the setting operation/resetting operation has increased and deterioration of the variable resistance element VR in the memory cell MC has progressed, the value of the resetting verify voltage $V_{rv}$ is set to a value which is smaller than $V_{rv0}$ (such as $V_{rv1}$, $V_{rv2}$, and so on) according to a degree of that deterioration. The degree of deterioration can be judged by executing a judgment mode described below.

Judgment Mode

Next, the judgment mode for judging the degree of easiness of completion of the resetting mode of the memory cell MC (degree of change of resistance of the memory cell) is described with reference to FIG. 9. The judgment mode is an independent operation distinct from the resetting mode. In the judgment mode, after the setting operation is performed on a plurality of the memory cells MC in the judgment-dedicated memory cell array 1J, a certain number of times (for example, one time) of the resetting operations are performed on the memory cells MC that were subject to that setting operation. Moreover, the judgment mode judges the distribution of the on-voltage Von of the plurality of memory cells MC after this resetting operation. More specifically, after execution of the certain number of times (for example, one time) of the resetting operations, a judgment voltage Vj is applied to the memory cell MC to judge whether a conductive state has been attained or not. The larger the number of memory cells MC that have attained a conductive state, the more that the degree of easiness of completion of the resetting mode of the memory cells MC has fallen. Therefore, in the state machine 7, judgment mode counts the number of memory cells MC that have attained a conductive state, and the resetting verify voltage $V_{rv}$ is determined based on that counting result. For example, the memory cells MC in the judgment-dedicated memory cell array 1J directly after shipment of the resistance change memory device are in a non-deteriorated state where the resetting operation can be easily performed, hence one time of the resetting operation allows a voltage distribution J1 shown in FIG. 9 to be obtained, for example. In this case, the number of memory cells MC that attain a conductive state due to the judgment voltage Vj is small.

Figure 9:
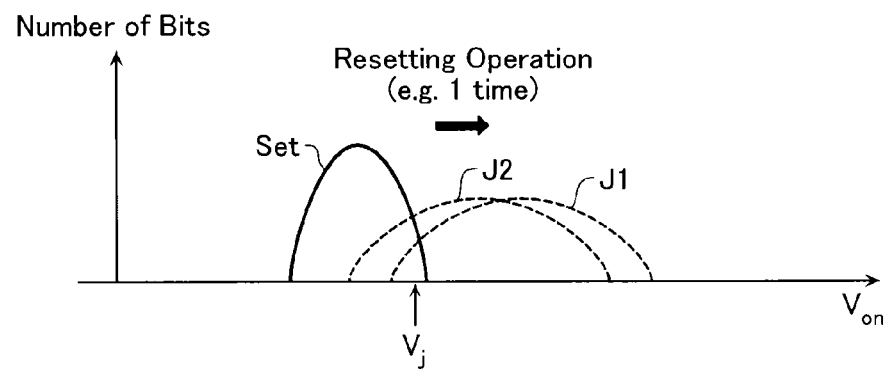
FIG. 9 explains the resetting operation (judgment mode) in the nonvolatile memory according to the first embodiment.

On the other hand, when the cumulative number of times of executions of the setting operation/resetting operation increases and the memory cells MC deteriorate, a range of change in resistance value due to one time of the resetting operation is reduced, whereby for example, as shown in FIG. 9, a voltage distribution J2 having a distribution biased more to a negative side than the previously described voltage distribution J1 is obtained. When the voltage distribution J2 is obtained, the number of memory cells MC that attain a conductive state by application of the judgment voltage Vj is increased compared to when the voltage distribution J1 is obtained. By judging the number of memory cells that attain a conductive state in this way, the degree of easiness of completion of the resetting operation of the memory cells MC may be judged, and thereby the resetting verify voltage $V_{rv}$ may be adjusted. Adjusting the resetting verify voltage $V_{rv}$ enables the resetting mode to be completed in line with deterioration of the memory cells, whereby operation time can be made uniform. In addition, if the resetting verify voltage Vrv is not adjusted, an excessive voltage for resetting the deteriorated memory cells needs to be applied, which in turn accelerates deterioration of the memory cells and thereby reduces a life span of the memory cells. Adjusting the resetting verify voltage $V_{rv}$ allows application of an excessive voltage to the memory cells to be prevented and the life span of the memory cells to be lengthened.

Note that this judgment mode may be executed every time the resetting mode is performed, or may be performed every time the cumulative number of times of executions of the setting operation/resetting operation reaches a certain number of times.

Figure 10:
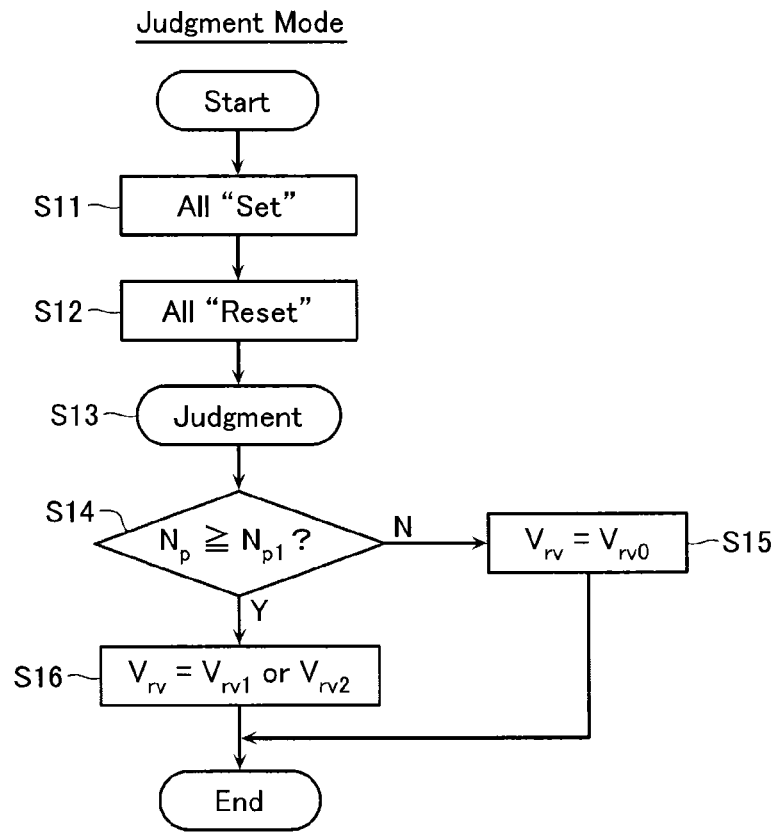
FIG. 10 explains the resetting operation (judgment mode) in the nonvolatile memory according to the first embodiment.

Next, a specific operation sequence of the judgment mode in the first embodiment is described with reference to the flowchart of FIG. 10.

First, the setting operation is executed on all of the memory cells MC in the judgment-dedicated memory cell array 1J to obtain a required voltage distribution (Set) (S11).

Then, the resetting operation for a judgment operation is executed for example one time only on all of the memory cells MC in the judgment-dedicated memory cell array 1J for which the setting operation has been completed (S12). Then, a read operation using the judgment voltage Vj is performed sequentially on all of the memory cells MC in the judgment-dedicated memory cell array 1J to count the number Np of memory cells MC that attain a conductive state due to this read operation (S13). Counting of the number Np is executed by a counting circuit (not illustrated) provided in the column control circuit 2.

In following step S14, it is judged whether or not this number Np is a certain number Np1 or more. If the judgment result is negative (NO), then the resetting verify voltage $V_{rv}$ is set to the voltage $V_{rv0}$ which is a reference value (S15). On the other hand, if the judgment result is positive (YES), then a voltage value of the resetting verify voltage $V_{rv}$ is set to the voltage $V_{rv1}$ or $V_{rv2}$, according to magnitude of the number Np (S16). As a result of the above, the judgment mode is completed and a value of the resetting verify voltage $V_{rv}$ is set to an appropriate value.

Examples of Configuration of Judgment-Dedicated Memory Cell Array 1J

Next, examples of configuration of the judgment-dedicated memory cell array 1J are described with reference to FIGS. 11 and 12.

Figure 11:
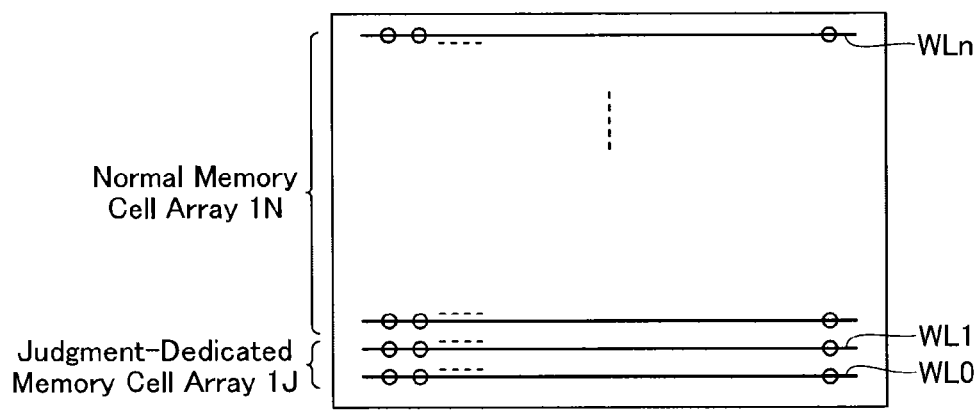
FIG. 11 shows an example of configuration of a judgment-dedicated memory cell array 1J.

FIG. 11 is a first example of configuration of the judgment-dedicated memory cell array 1J. In this first example of configuration, the judgment-dedicated memory cell array 1J is formed by the memory cells formed along the word lines WL0 and WL1 in the memory cell array 1, and the normal memory cell array 1N is formed by the other memory cells in the memory cell array 1.

Figure 12:
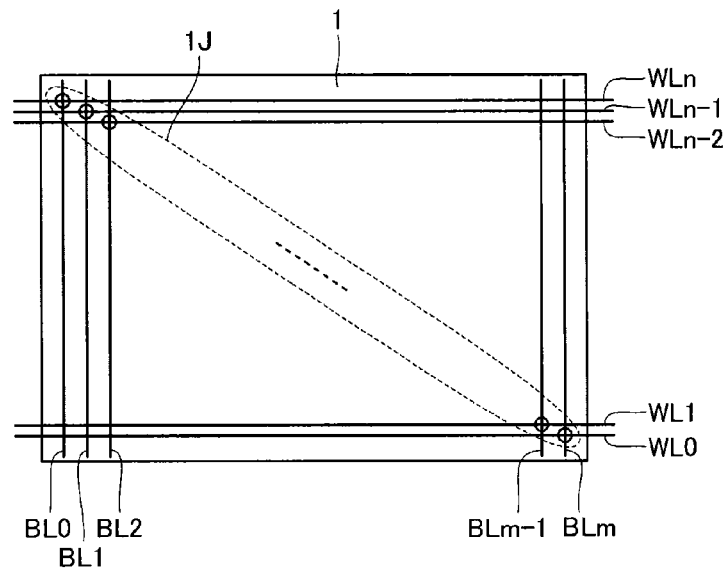
FIG. 12 shows an example of configuration of a judgment-dedicated memory cell array 1J.

FIG. 12 is a second example of configuration of the judgment-dedicated memory cell array 1J. This second example of configuration differs from the first example of configuration in having the judgment-dedicated memory cell array 1J formed in a dispersed manner over the entire memory cell array 1. That is, the memory cells forming the judgment-dedicated memory cell array 1J are not formed in a concentrated manner along a small number of the word lines WL, but are formed in a dispersed manner along a larger number of word lines (for example, all of the word lines in the memory cell array 1). In other words, rather than having all of the memory cells MC along single word lines WL forming the judgment-dedicated memory cell array 1J, only part of the memory cells MC along single word lines WL form the judgment-dedicated memory cell array 1J. However, in order to speed up operation of the judgment mode, it is preferable that there be one memory cell configuring the judgment-dedicated memory cell array 1J formed along a single bit line BL. Note that in the judgment mode, different memory cells may be selected in the judgment-dedicated memory cell array 1J every time a different judgment mode is executed. Or the same memory cells may be selected at any time. [Advantages]

The present embodiment enables the value of the resetting verify voltage to be set appropriately according to the degree of deterioration of the memory cells, thereby allowing time required for the resetting operation to be made uniform regardless of the degree of deterioration of the memory cells. In addition, if the resetting verify voltage Vrv is not adjusted, an excessive voltage for resetting the deteriorated memory cells needs to be applied, which in turn accelerates deterioration of the memory cells and thereby reduces a life span of the memory cells. Adjusting the resetting verify voltage $V_{rv}$ allows application of an excessive voltage to the memory cells to be prevented and the life span of the memory cells to be lengthened.

Second Embodiment

Next, a nonvolatile memory according to a second embodiment is described with reference to FIG. 13. A structure of the nonvolatile memory in the second embodiment is substantially identical to that in the first embodiment (FIGS. 1~6). However, the present embodiment differs from the first embodiment in that not only is the resetting verify voltage $V_{rv}$ for judging completion of the resetting operation during the resetting operation changed, but also a setting verify voltage $V_{sv}$ for judging completion of the setting operation during the setting operation is changed.

Figure 13:
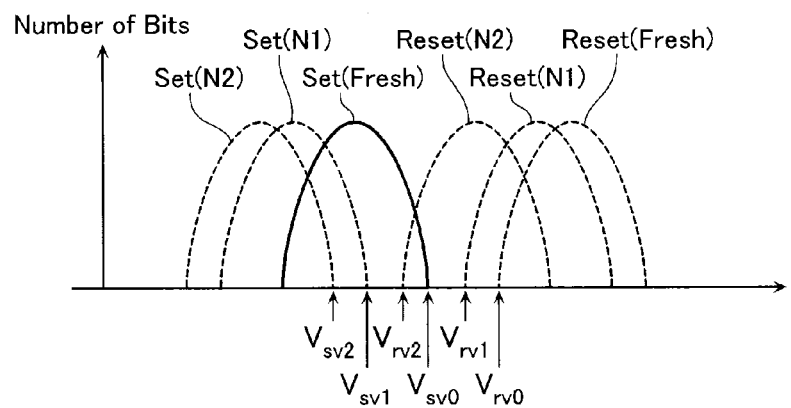
FIG. 13 shows a second embodiment.

That is, as shown in FIG. 13, a voltage value of the setting verify voltage $V_{sv}$ is changed between for example $V_{sv0}$, $V_{sv1}$, and $V_{sv2}$ in accordance with the previously mentioned judgment result of the judgment mode. Assuming that as previously described only the voltage value of the resetting verify voltage $V_{rv}$ is lowered according to the degree of deterioration of the memory cells MC and that the setting verify voltage $V_{sv}$ is constant, voltage distributions of memory cells in a set state and memory cells in a reset state approach one another, whereby a margin between the two is reduced. If the margin is small, then the probability of a misread or the like occurring increases. Therefore, in the present embodiment, to match a change in the resetting verify voltage $V_{rv}$, the value of the setting verify voltage $V_{sv}$ is also changed, whereby the margin can be held constant regardless of the degree of deterioration of the memory cells.

Other

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 14:
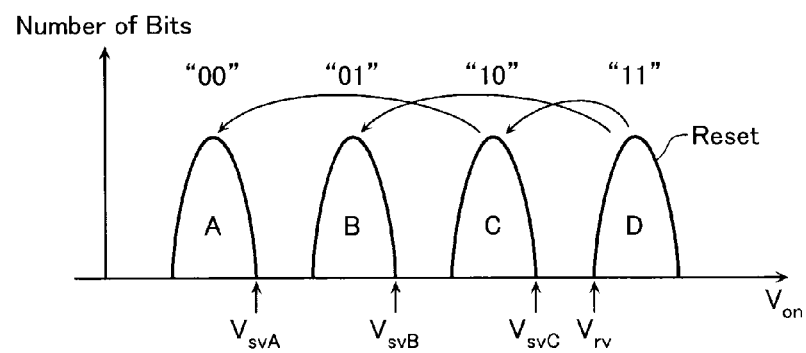
FIG. 14 shows a modified example.

For example, the previously described embodiments described an example where data write is performed such that the memory cell MC includes either of "1" (reset state) or "0" (set state) (one bit/cell). However, the present invention is not limited to this example. For example, as shown in FIG. 14, it may also be applied to a device in which a single memory cell MC may include four kinds of voltage distributions A~D, and is capable of storing two bits of data in the single memory cell. Also in this case, the resetting verify voltage $V_{rv}$ for obtaining the reset state (voltage distribution D) can be changed according to the judgment result in the judgment mode. Moreover, additionally to this, the voltage value of the setting verify voltage $V_{sv}$ may also be changed according to the judgment result of the judgment mode.

Figure 15:
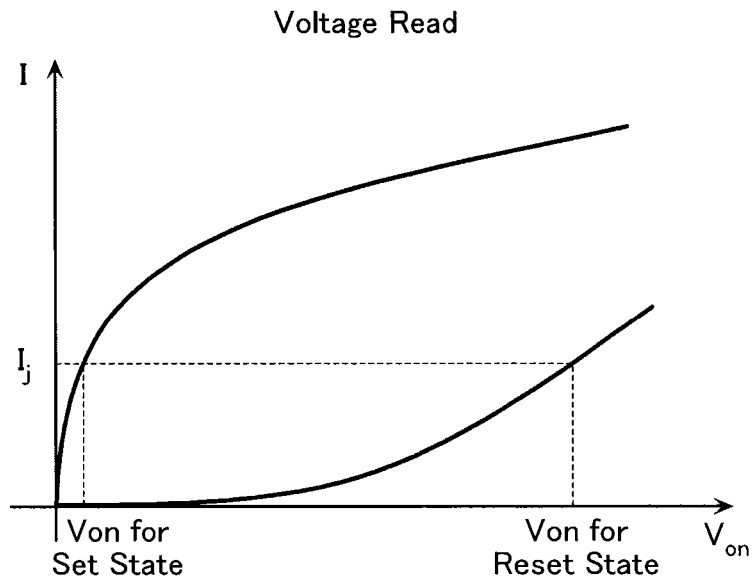
FIG. 15 shows a modified example.
Figure 16:
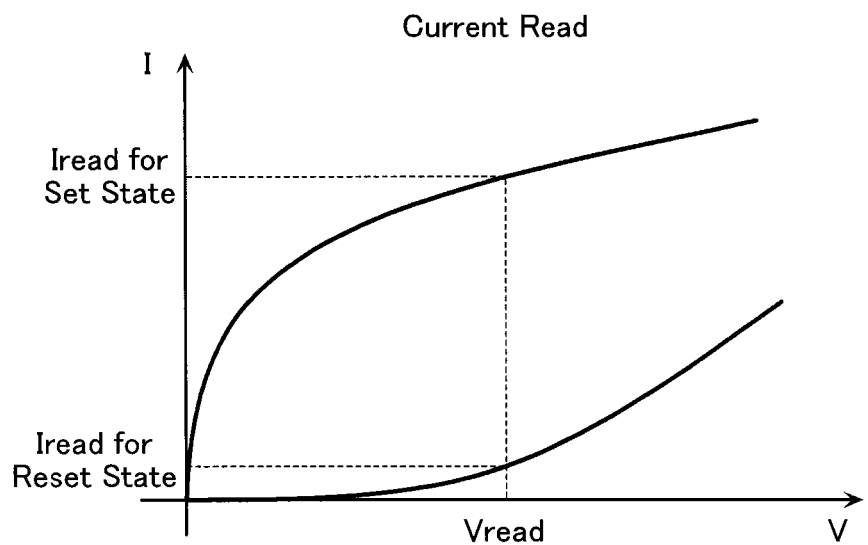
FIG. 16 shows a modified example.

In addition, as shown in FIG. 15, the previously described embodiments judge whether data retained by the memory cell MC is "1" or "0" by measuring an on-voltage Von of the memory cell MC (minimum value of a voltage at which the memory cell MC can switch from a non-conductive state to a conductive state and current reaches a current value for judgment Ij). However, the present invention is not limited to this configuration. For example, as shown in FIG. 16, it is also possible to measure a read current value Iread in a certain read voltage Vread. When a memory cell attains a low-resistance state, the on-voltage Von lowers and the on-current Ion increases, hence a similar judgment can be performed.

What is claimed is:

1. A semiconductor memory device, comprising:
a memory cell array configured as an arrangement of memory cells disposed at intersections of a plurality of first lines disposed substantially in parallel and a plurality of second lines disposed to intersect the first lines, each of the memory cells including a variable resistance element; and
a control circuit configured to control the memory cell array,
the control circuit being configured to change a voltage value of a resetting verify voltage applied for confirming completion of a resetting mode according to a degree of change of resistance of the memory cell when performing the resetting operation to change the memory cell from a low-resistance state to a high-resistance state.

2. The semiconductor memory device according to claim 1, wherein
the control circuit is configured capable of executing a judgment mode for judging the degree of change of resistance of the memory cell in the resetting operation, in addition to the resetting mode, and
the control circuit changes the voltage value of the resetting verify voltage based on a judgment result of the judgment mode.

3. The semiconductor memory device according to claim 2, wherein
the judgment mode executes the resetting operation on a first memory cell group in the memory cell array, and judges the degree of change of resistance of the memory cell based on the number of memory cells in the first memory cell group that have changed to a first resistance state.

4. The semiconductor memory device according to claim 3, wherein
before the resetting operation on the first memory cell group, the judgment mode executes on the first memory cell group a setting operation to change the memory cell from the high-resistance state to the low-resistance state.

5. The semiconductor memory device according to claim 3, wherein
the plurality of second lines are each connected to a row decoder, and the first memory cell group is selected from the memory cells connected to a single one of the plurality of second lines.

6. The semiconductor memory device according to claim 3, wherein
the plurality of first lines are each connected to a sense amplifier, and the first memory cell group is selected one each from the memory cells connected to a single one of the plurality of first lines.

7. The semiconductor memory device according to claim 1, wherein
the control circuit changes a voltage value of a setting verify voltage applied for confirming completion of a setting operation when the setting operation is performed, according to the degree of change of resistance of the memory cell when performing the resetting operation.

8. The semiconductor memory device according to claim 7, wherein
the control circuit is configured capable of executing a judgment mode for judging the degree of change of resistance of the memory cell in the resetting operation, in addition to the resetting mode, and
the control circuit changes the voltage value of the resetting verify voltage based on a judgment result of the judgment mode.

9. The semiconductor memory device according to claim 8, wherein
the judgment mode executes the resetting operation on a first memory cell group in the memory cell array, and judges the degree of change of resistance of the memory cell based on the number of memory cells in the first memory cell group that have changed to a first resistance state.

10. The semiconductor memory device according to claim 9, wherein
before the resetting operation on the first memory cell group, the judgment mode executes on the first memory cell group a setting operation to change the memory cell from the high-resistance state to the low-resistance state.

11. The semiconductor memory device according to claim 9, wherein
the plurality of second lines are each connected to a row decoder, and the first memory cell group is selected from the memory cells connected to a single one of the plurality of second lines.

12. The semiconductor memory device according to claim 9, wherein
the plurality of first lines are each connected to a sense amplifier, and the first memory cell group is selected such that a single memory cell is selected from among the memory cells connected to single one of the plurality of first lines.

13. A method of controlling a semiconductor memory device, the semiconductor memory device including a memory cell array configured as an arrangement of memory cells disposed at intersections of a plurality of first lines disposed substantially in parallel and a plurality of second lines disposed to intersect the first lines and each including a variable resistance element, the method comprising:
judging a degree of change of resistance of the memory cell when performing a resetting operation to change the memory cell from a low-resistance state to a high-resistance state; and
changing a voltage value of a resetting verify voltage applied for confirming completion of a resetting mode, according to a result of the judgment.

14. The method of controlling a semiconductor memory device according to claim 13, wherein
the judgment executes the resetting operation on a first memory cell group in the memory cell array, and judges the degree of change of resistance of the memory cell based on the number of memory cells in the first memory cell group that have changed to a first resistance state.

15. The method of controlling a semiconductor memory device according to claim 14, wherein
prior to the resetting operation on the first memory cell group, the judgment executes on the first memory cell group a setting operation to change the memory cell from the high-resistance state to the low-resistance state.

16. The method of controlling a semiconductor memory device according to claim 15, wherein
the voltage value of a setting verify voltage applied for confirming completion of the setting mode is changed according to the degree of change of resistance of the memory cell when performing the resetting operation.

17. The method of controlling a semiconductor memory device according to claim 14, wherein
the plurality of second lines are each connected to a row decoder, and the first memory cell group is selected from the memory cells connected to a single one of the plurality of second lines.

18. The method of controlling a semiconductor memory device according to claim 14, wherein
the plurality of first lines are each connected to a sense amplifier, and the first memory cell group is selected such that a single memory cell is selected from among the all memory cells connected to single one of the plurality of first lines.

* * * * *